United States Patent [19]

Agazzi

[11] Patent Number: 4,999,627
[45] Date of Patent: Mar. 12, 1991

[54] ANALOG-TO-DIGITAL CONVERTER USING PRESCRIBED SIGNAL COMPONENTS TO IMPROVE RESOLUTION

[75] Inventor: Oscar E. Agazzi, Scotch Plains, N.J.

[73] Assignee: AT&T Bell Laboratories, Murray Hill, N.J.

[21] Appl. No.: 412,258

[22] Filed: Sep. 25, 1989

[51] Int. Cl.⁵ .............................................. H03M 1/20
[52] U.S. Cl. .................................... 341/131; 341/118; 341/120; 341/143; 341/155; 341/156; 341/162
[58] Field of Search ............... 341/118, 120, 131, 143, 341/155, 156, 162

[56] References Cited

U.S. PATENT DOCUMENTS

| | | | |
|---|---|---|---|
| 3,956,746 | 5/1976 | Lisle, Jr. et al. | 341/156 |
| 4,447,803 | 5/1984 | Crosby et al. | 341/131 |
| 4,612,533 | 9/1986 | Evans | 341/156 |
| 4,746,902 | 5/1988 | Tol et al. | |
| 4,792,787 | 12/1988 | Speiser et al. | 341/156 |
| 4,797,653 | 1/1989 | Takayama | 341/143 |
| 4,851,841 | 7/1989 | Sooch | 341/143 |
| 4,860,012 | 8/1989 | Rich et al. | 341/143 |
| 4,866,442 | 9/1989 | Steim et al. | 341/155 |

OTHER PUBLICATIONS

*Digital Communications*, Published by McGraw Hill, 1983, by John G. Proakis, pp. 412–417.
*Proceedings of the 1988 IEEE Custom Integrated Circuits Conference*, Rochester, NY, May 1988, "A 13 Bit 160 KHz Sigam–Delta A/D Converter for ISDN", by S. R. Norsworthy and I. G. Post, pp. 21.3.1–21.3.4.
*IEEE Transactions on Communications*, vol. COM-33, No. 3, Mar. 1985, "A Use of Double Integration in Sigma–Delta Modulation", by James C. Candy, pp. 249–258.

Primary Examiner—William M. Shoop, Jr.
Assistant Examiner—Nancy Le
Attorney, Agent, or Firm—L. H. Birnbaum

[57] ABSTRACT

An input analog signal having a prescribed component is coverted into an n bit digital signal using low resolution circuitry. An m>n bit digial signal representative of the prescribed component is generated from stored information and past samples of the digital output signal and transformed into a coarsely quanitized analog signal. The prescribed component representative analog signal is subtracted from the input analog signal to form a difference representative signal which is converted into an n-m bit digital signal and them bit digital signal is combined with the n-m bit difference representative signal to produce an n bit digtial signal corresponding to the input analog signal.

11 Claims, 4 Drawing Sheets

4,999,627

ANALOG-TO-DIGITAL CONVERTER USING PRESCRIBED SIGNAL COMPONENTS TO IMPROVE RESOLUTION

FIELD OF THE INVENTION

The invention relates to electronic converters and more particularly to arrangements for converting analog signals into digital signals.

BACKGROUND OF THE INVENTION

In signal processing systems, an analog signal is often converted to digital form to take advantage of the better precision, lower noise and the large scale integration economy of digital processing. The analog-to-digital conversion preceding digital processing must be very precise to avoid errors in the digital processing. The required precision is usually obtained by using large high resolution converters with compensation networks, component trimming or oversampling of signals.

U.S. Pat. No. 4,746,902 issued to Tol et al, May 24, 1988, dicloses an arrangement that compensates for nonlinear distortion in an input signal to be digitized having an analog-to-digital converter that converts the input signal into an amplitude-time discrete output signal. Processing apparatus derives a set of coefficients associated with an orthogonal signal representation of a signal related to the input signal. A table storing correction values is addressed by a signal derived from the set of coefficients to produce a correction value. The correction value and the analog-to-digital converter output signal are summed to provide a linearized signal and an adaptive control loop substitutes a new correction value for the correction value read from the table. While the arrangement corrects for distortion generated by the analog-to-digital converter, it has limited application and does not improve the resolution of the converter or reduce its complexity or size.

U.S. Pat. No. 4,612,533 issued to Evans, Sept. 16, 1986, describes a harmonic distortion reduction technique for data acquisition to provide fast conversion rates in which a subrange digital-to-analog converter (DAC) is augmented with a software calibrated DAC to remove system nonlinearities. Harmonic distortion is reduced by adding a correction to the input of the subrange DAC or by using a look up table at the output of the ADC. While the harmonic distortion reduction is achieved, it requires both a main ADC and a subrange DAC converter. The resulting arrangement, however, is highly dependent on analog components and analog processing and is relatively slow since it is necessary to delay the operation of the subrange DAC until each cycle of operation of the main ADC is completed.

In many signal processing arrangements, a component of an input analog signal may be known in advance or synthesizable by prediction filtering techniques. The aforementioned arrangements provide conversion of an unknown analog signal into a high resolution digital form without utilizing such previously known characteristics. It is an object of the invention to provide improved resolution analog-to-digital conversion for signals having known or synthesizable components.

BRIEF SUMMARY OF THE INVENTION

The invention is directed to an analog-to-digital converter adapted to convert an input signal having a known component. A low resolution digital signal is generated to represent the known component of the input signal, and an analog signal corresponding to the known component representative signal is subtracted from the input analog signal to form a reduced magnitude difference signal. The reduced magnitude difference signal is converted into a digital signal which is combined with the known component digital signal to provide a digital version of the input analog signal. Advantageously, the conversion of the reduced magnitude difference signal provides a high resolution result with lower resolution converters.

DETAILED DESCRIPTION

Figure 1:
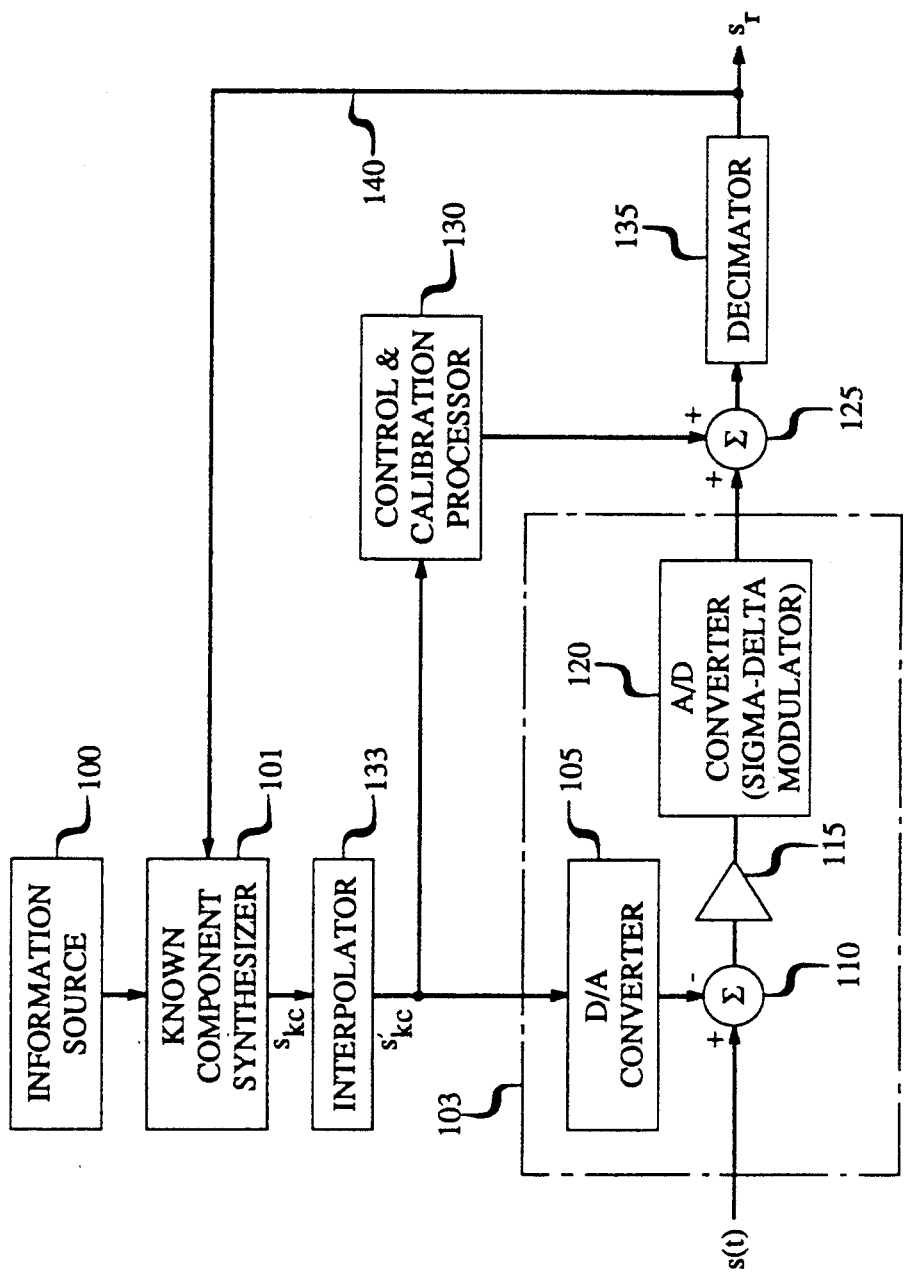
FIG. 1 depicts a general block diagram of an analog-to-digital converter illustrative of the invention.

FIG. 1 shows an analog-to-digital converter illustrative of the invention that converts an input analog signal $s(t)$ to a sequence of digital samples $s_1, s_2, \ldots s_r \ldots$ with a predetermined resolution of n bits. The information stored in source 100 is used to predict the present value of signal $s(t)$. This information is known independently of the input signal, may be obtained from another source or adaptively developed. The circuit of FIG. 1 may be employed in a measurement or data acquisition system where the dynamics are known, e.g., an oven temperature sensing arrangement. In such a system, source 100 stores parameters and past values of the measured temperature describing the oven control characteristics and past measurement values. The stored signals are used to predict future values of temperature. The source supplies the information to known component synthesizer 101 which generates a relatively coarse digital signal $s_{kc}(r)$ predictive of a prescribed component of signal $s(t)$. The parameters of synthesizer 101 are predetermined or may be adaptively developed. The output of the circuit of FIG. 1 may also be fed back to synthesizer 101 via line 140 so that it adapts its operation to the processing of signal $s(t)$. The adaptation may be done by methods well known in the art. Synthesizer 101 may comprise a signal processor implementing a Kalman type filter such as described in *Digital Communications* by John G. Proakis published by McGraw Hill, 1983, at pages 412 through 417. The resolution or signal $s_{kc}(r)$ may be m<n bits. Digital-to-analog converter 105 transforms the m bit digital signal $S_{kc}(r)$ from synthesizer 101 into a coarsely quantized analog signal corresponding to the prescribed component in signal $s(t)$.

The quantized analog version of the prescribed component from D/A converter 105 is sent to analog summing circuit 110 wherein it is subtracted from signal $s(t)$. Summing circuit 110 generates a signal $$s_{diff}(t) = s(t) - s_{kc}(r) . \tag{1}$$

The prescribed component in the incoming signal $s(t)$ is thereby partially canceled by the signal $s_{kc}(r)$ generated from the known information. Greater resolution may be obtained by amplifying the difference signal $s_{diff}(r)$. This is done by amplifier 115. The resulting amplified difference signal is supplied to the input of A/D converter 120. Since signal $s_{diff}(t)$ is generally substantially smaller than the input signal s(t), the A/D conversion of amplified signal $s_{diff}(t)$ need only have n-m bit resolution and may be substantially simplified compared to the n bit converter generally required.

Digital summing circuit 125 adds the n-m bit output of A/D converter 120 and a version of m bit digital signal $s_{kc}(r)$ generated in synthesizer 101 to complete the conversion of signal s(t) to digital samples $s_r$. In accordance with the invention, the conversion of an analog signal to a sequence of digital samples is accomplished using much lower resolution conversion devices. An m bit D/A converter and n-m bit A/D converter are employed in FIG. 1 to obtain n bit resolution. m and n may be 5 and 18, respectively. In this case, A/D converter 120 has 13 bit resolution. Other combinations of m and n may be used.

A/D converter 120 may comprise a single ended sigma-delta modulator of the general type described in the article "A 13 Bit 160 KHz Sigma- Delta A/D Converter for ISDN" by S. R. Norsworthy and I. G. Post appearing in the *Proceedings of the 1988 IEEE Custom Integrated Circuits Conference*, Rochester, N.Y., May 1988, pp. 21.3.1-21.3.4. As is well known in the art, sigma-delta modulators operate at a much higher rate than that required for the output signal $s_r$. Interpolator 133 increases the sampling rate of signal $s_{kc}(r)$. The increased sampling rate signal $s_{kc}(r)'$ is supplied to D/A converter 105. Decimator 135 reduces the sampling rate of the n bit output of summing circuit 125 to accommodate the use of the sigma-delta modulator. It is to be understood that other types of devices may be used as analog-to-digital converter 120 so that interpolation and decimation may not be required. In this case, interpolator 133 and 135 are not needed in the circuit of FIG. 1 and signal $s_{kc}(r)$ is directly applied to D/A converter 105.

The circuit of FIG. 1 also includes control and calibration processor 130. The calibration processor stores signals representing errors due to component variation in digital-to-analog converter 105, summer 110 and A/D converter 120. The m bit digital component replica signal from synthesizer 101 and interpolator 133 is processed in calibration processor 130 to compensate for the effects of component variation in signal $s_r$ obtained from digital summing circuit 125.

Figure 4:
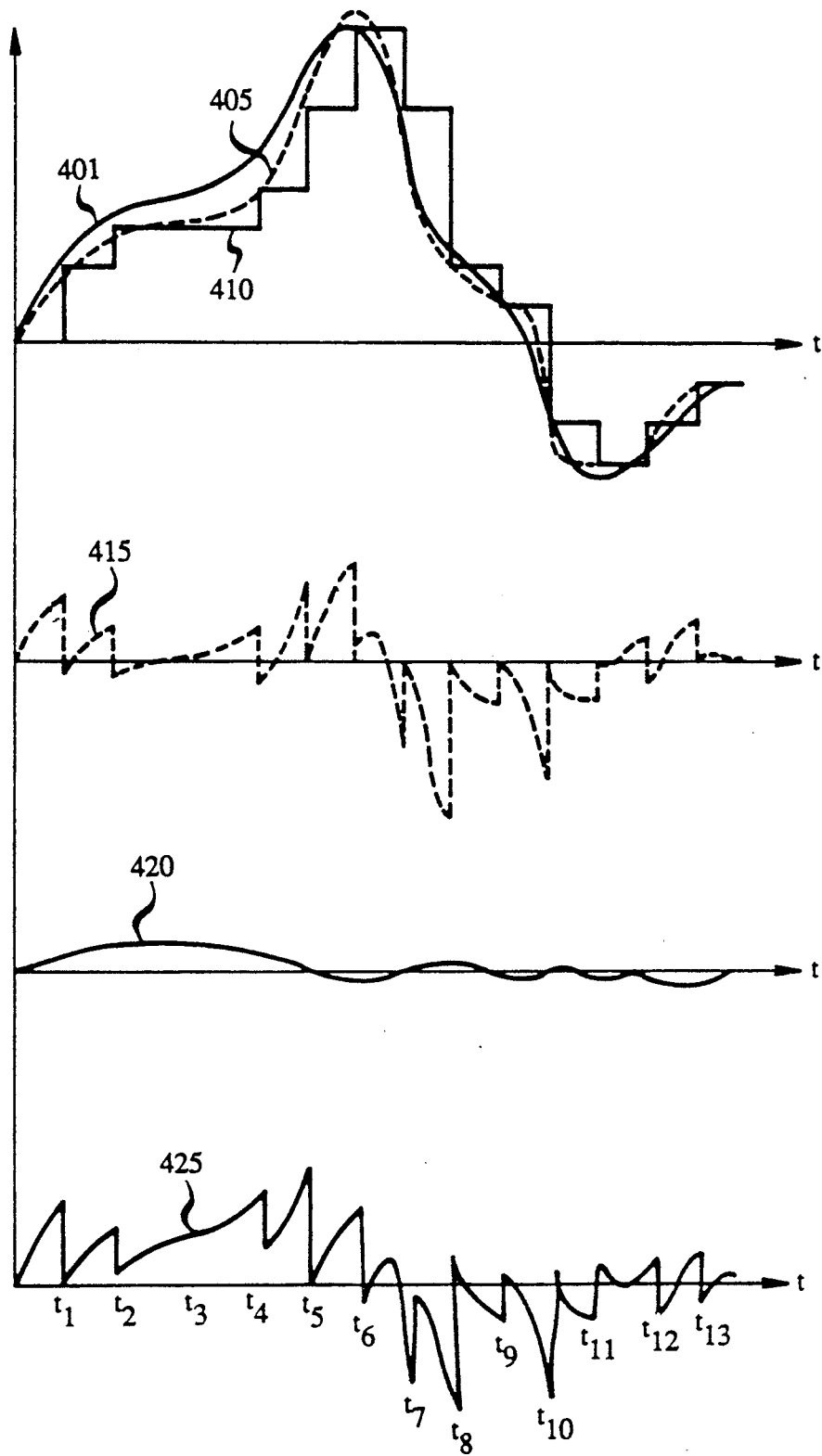
FIG. 4 shows waveforms illustrating the operation of the circuit of FIG. 1.

FIG. 4 shows waveforms illustrating the operation of the circuit of FIG. 1. Referring to FIG. 4, waveform 401 shows incoming analog signal s(t) which is applied to one input of analog summing circuit 110. Waveform 405 conceptually illustrates the known component of signal s(t) but does not actually appear in the circuit. Waveform 410 corresponds to the quantized signal $s'_{kc}(r)$ obtained from interpolator 103. Signal $S_{kc}(r)$ is synthesized by synthesizer 101 responsive to the component information in source 100 and the past values of digital output $s_r$.

Digital-to-analog converter 105 is constructed to have low resolution so that the analog component replica therefrom is only a coarse approximation $s_{kc}(r)$ of the known component of signal s(t). The difference between the signals shown in waveforms 401 and 410 has two components. Waveform 420 shows the component corresponding to the difference between waveforms 401 and 405. Waveform 415 shows the quantizing noise component owing to the coarse quantization in digital-to-analog converter 105. Waveform 425 illustrates the difference signal $s_{diff}(r)$ obtained at the output of summing circuit 110 which is the sum of components 415 and 420. An n-m bit digital signal is formed from the amplified version of signal $s_{diff}(r)$, and the n-m digital signal is combined with the m bit component replica signal obtained via calibration processor 130. The resulting digital signal represents signal s(t) with n bit resolution.

Figure 2:
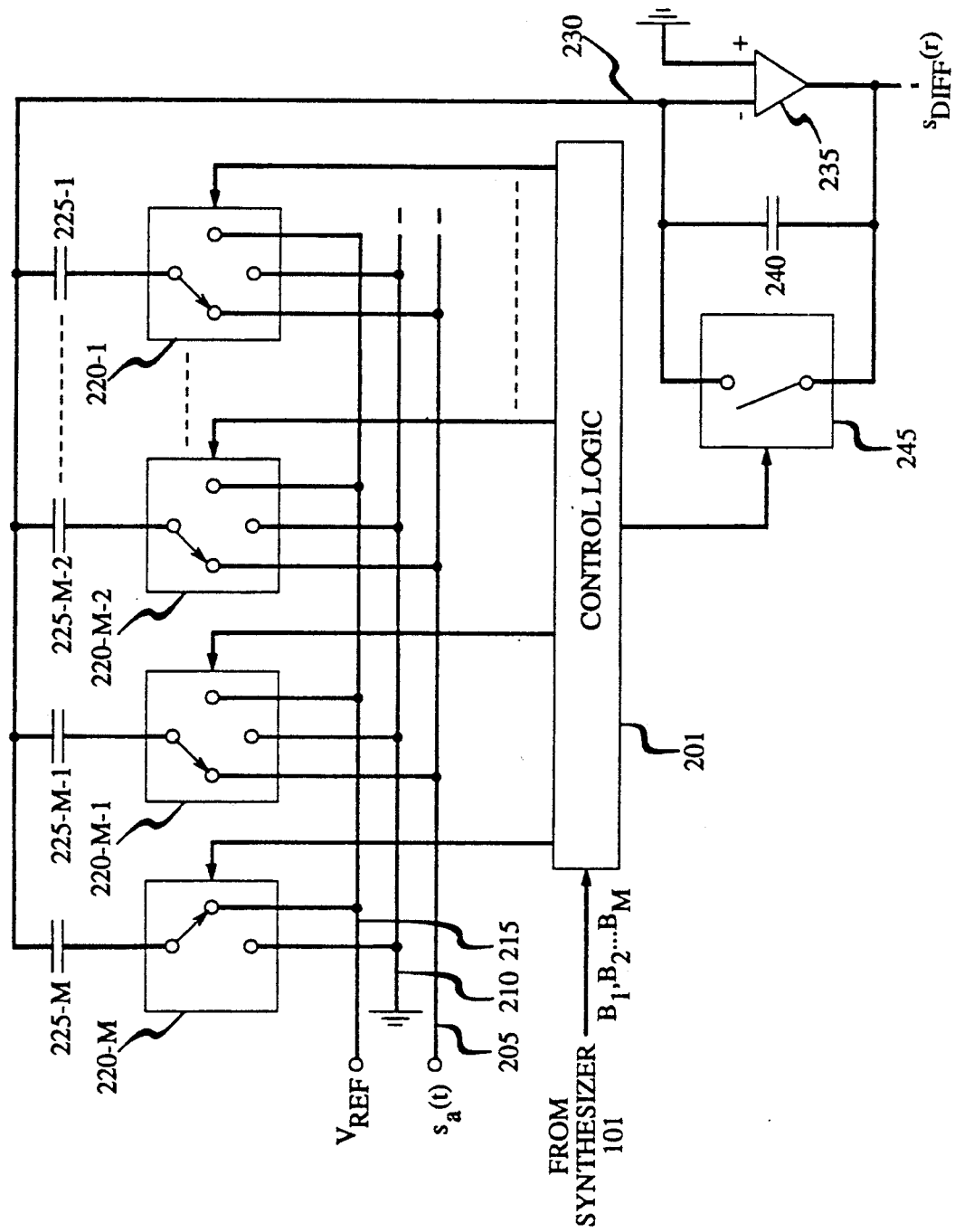
FIG. 2 shows a more detailed block diagram of a circuit that may be used as digital-to-analog converter 105, summing circuit 110 and amplifier 115 in FIG. 1.

A circuit that functions as digital-to-analog converter 105 and analog summer 110 is shown in greater detail in FIG. 2. This arrangement does not use a sigma-delta modulator so that interpolator 133 and decimator 135 are not required in the circuit of FIG. 1. The circuit of FIG. 2 includes switches 220-1 through 220-M, capacitors 225-1 through 225-M, operational amplifier 235, capacitor 240 and switch 245. Capacitors 225-1 through 225-M in cooperation with switches 220-1 through 220-M provide a charge redistribution type network controlled by control logic 201. Amplifier 235 functions as amplifier 115 in FIG. 1. A charge signal corresponding to the difference between signal s(t) and the m bit digital signal from synthesizer 101 is transferred via lead 230 to capacitor 240 which provides an amplified difference signal. The values of capacitors 225-1 through 225-M are selected in ascending binary order. Capacitor 225-M corresponds to the most significant bit of the m bit signal from synthesizer 101. Capacitor 225-M-1 is one-half the value of capacitor 225-M, and capacitor 225-M-2 is one-fourth the value of capacitor 225-M. Capacitor 225-1 corresponds to the least significant bit of the synthesizer output and is $\frac{1}{2}^M$ of the value of capacitor 225-M.

The circuit of FIG. 2 operates on each m bit sample output of the synthesizer. In the first portion of each sampling period, switch 245 is closed discharging integrator capacitor 240. The upper plates of capacitors 225-1 through 225-M are connected to virtual ground through line 230, switch 245 and the ground at the positive input of amplifier 235. Switches 220-1 through 220-M-1 connect the lower plates of capacitors 225-1 through 225-M-1 to line 205 so that these capacitors are charged to the present value of incoming signal s(t). Switch 220-M connects capacitor 225-M to line 215 so that it is charged to voltage $V_{ref}$. During the second interval of the sampling period, switch 245 is opened. Switches 220-1 through 220-M are connected either to ground via line 210 or to voltage $V_{ref}$ via line 215 according to the state of the corresponding bit $B_k$ (k=1, 2, ..., M) of the m bit signal from synthesizer 101. If the most significant bit $B_M$ is a one, switch 220-M connects the lower plate of capacitor 225-M to ground. If the less significant bits $B_1$ through $B_{M-1}$ are ones, the lower plates of capacitors 225-1 through 225-M-1 are connected to line $V_{ref}$. The charges on capacitors 225-1 to 225-M are thereby redistributed and the resultant charge is transferred to capacitor 240. The output of amplifier 235 is then $$s_{diff}(n) = s(n) \frac{C_T}{C_I} + \left( B_M C_M - \sum_{k=1}^{M-1} B_k C_k \right) \left( \frac{V_{ref}}{C_I} \right) \quad (2)$$

where $$C_T = \sum_{k=1}^{M-1} C_K$$

k is the bit position in the filter output sample. $C_M$ through $C_1$ correspond to capacitors 225-M through 225-1. $B_M$ is the state of the Mth bit of the filter output. $C_M$ is the Mth bit position capacitor and $C_I$ is the value of integrating capacitor 240. $C_T$ is the value of $C_1 + C_2 + \ldots + C_{M-1}$.

The output of amplifier 235 corresponding to charge $s_{diff}(r)$ is then $$\left(\frac{C_T}{C_I}\right) s_n + \left( B_M(C_M) - \sum_{k=1}^{M-1} B_k C_k \right) \left( \frac{V_{ref}}{C_I} \right). \quad (3)$$

Calibration processor 130 in FIG. 1 is adapted to generate and store calibrations signals $V_1, \ldots, V_M$ that compensate for variations in values of capacitors 225-1 through 225-M and capacitor 240. Signals $V_1, \ldots, V_M$ obtained at the output of summer 125 are stored int eh calibration processor so that they may be processed to generate correction signals to the m bit digital signal from filter 101. The calibration operations are performed under control of processor 130 when the circuit of FIG. 1 is turned on and may be repeated periodically during its operation.

During the calibration process, charge signals $$\begin{aligned} s_1 &= C_1 V_{ref} \\ s_2 &= (C_2 - C_1) V_{ref} \\ s_3 &= (C_3 - C_2 - C_1) V_{ref} \\ s_M &= (C_M - C_{M-1} - \ldots - C_1) \end{aligned} \quad (4)$$

where $C_1$ through $C_M$ are the capacitor values of capacitors 225-1 through 225-M are generated in the circuit of FIG. 2 and transferred to the circuit comprising operational amplifier 235 and capacitor 240. The charge signals are produced sequentially. In each sequential operation, there are two time intervals. In the first interval, integrator capacitor is discharged by closing switch 245. The lower plates of capacitors 225-1 through 225-M are connected either to voltage $V_{ref}$ on line 215 or to ground one line 210 via switches 220-1 through 220-M to charge in accordance with equation (4). In the second interval, switch 245 is opened. Switches 220-1 through 220-M are controlled by processor 130 to connect the lower plates of capacitors 225-1 through 225-M to transfer charge in accordance with equation (4).

Charge signal $s_1$ is produced by connecting the lower plate of capacitor 225-1 to voltage source $V_{ref}$ during the first interval and to ground during the second interval. The lower plates of capacitors 225-2 through 225-M are connected to ground during the first and second intervals. To generate charge signal $s_2$, capacitor 225-1 is connected to ground through switch 220-1 while capacitor 225-2 is connected to $V_{ref}$ through switch 220-2 during the first interval. In the second interval, the lower plate of capacitor 225-1 is connected to $V_{ref}$ while the lower plate of capacitor 225-2 is connected to ground. Switches 220-3 through 220-M connect the lower plates of capacitors 225-3 through 225-M to ground during both the first and second intervals.

Charge signals $s_3$ through $s_M$ are produced in similar manner.

As a result of charge signals $s_1, s_2, \ldots, s_M$, digital signals $V_1, V_2, \ldots, V_M$ appear at the output of summer 125. These signals are measured by the calibration processor and are stored therein. Signals $V_1, V_2, \ldots, V_M$ carry information about the true values of capacitors 225-1 through 225-M as well as the gain of amplifier 235 and analog-to-digital converter 120. The actual values of capacitors modified by the gain errors of amplifier 235 and converter 120 are obtained by processing to solve the system of equations $$\begin{aligned} V_1 &= C_{p1} \\ V_2 &= C_{p2} - C_{p1} \\ V_3 &= C_{p3} - C_{p2} - C_{p1} \\ V_M &= C_{pM} - C_{pM-1} - \ldots - C_{p1} \end{aligned} \quad (5)$$

and the true capacitor values normalized to the value of $C_I$ of capacitor 240 are $$\begin{aligned} C_{p1} &= V_1 \\ C_{p2} &= V_2 + C_{p1} \\ C_{p3} &= V_3 + C_{p2} + C_{p1} \\ C_{pM} &= V_M + C_{pM-1} + \ldots + C_{p1}. \end{aligned} \quad (4)$$

The values of equation (6) are used to modify the m bit digital signal from filter 101 to correct for variations of components in m bit digital-to-analog converter 105, analog summer 110, amplifier 115 and n-m bit analog-to-digital converter 120. There are $2^M$ possible values for the modified m bit digital signal. These values are stored in a random access memory of calibration processor 130. The correction values are addressed by the m bit digital signal form filter 101 and are added thereto prior to the summation in digital adder circuit 125.

Figure 3:
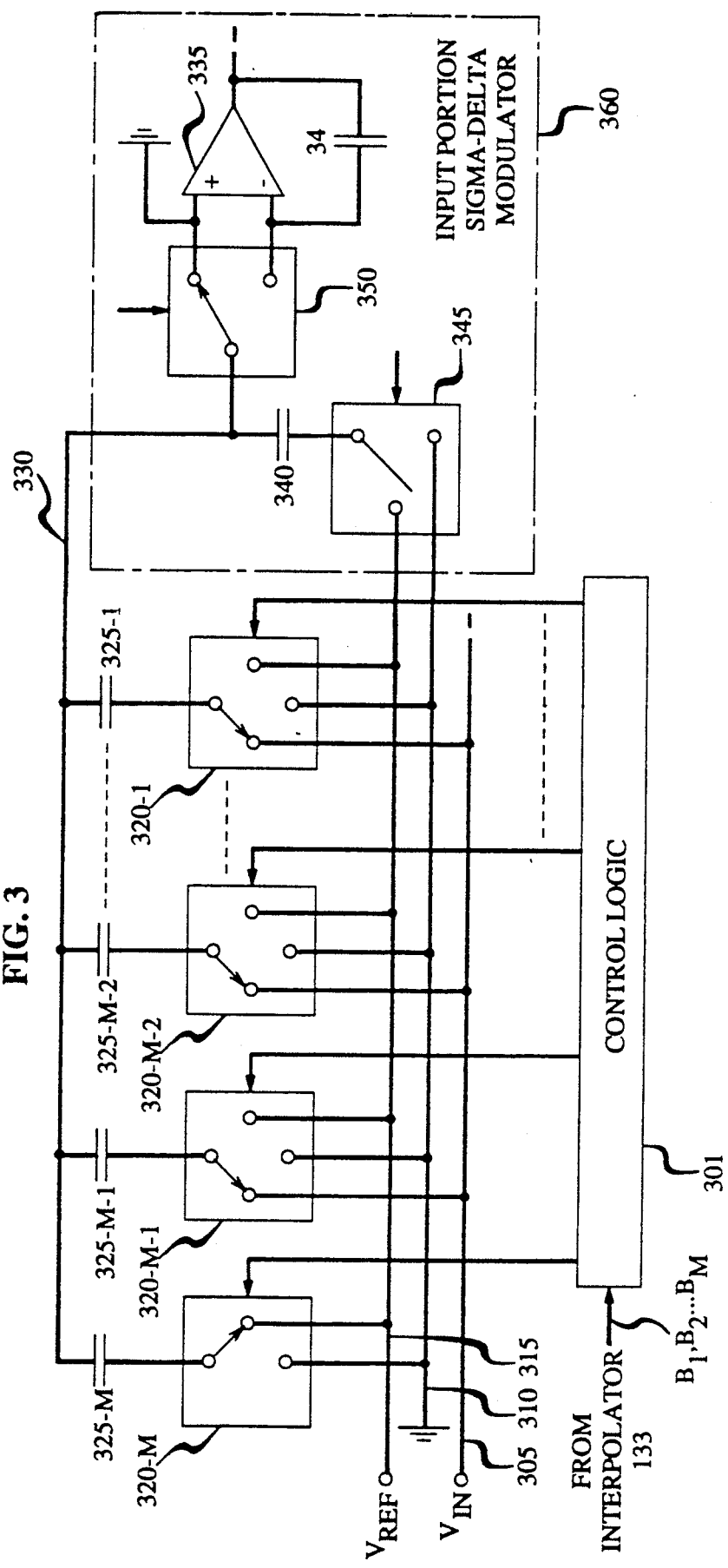
FIG. 3 shows a more detailed block diagram of another circuit that may be used as digital-to-analog converter 105, summing circuit 110 and amplifier 115 in FIG. 1.

As aforementioned, analog-to-digital converter 120 may comprise a sigma-delta converter. Amplifier 235 may be the input amplifier stage of the sigma-delta converter shown where the stage capacitor is replaced by capacitors 225-1 through 225-M and associated switches and controls. The input portion of a single ended sigma-delta modulator is shown in FIG. 3. A fully differential type may also be used. In this way, conversion unit 103 comprising digital-to-analog converter 105, analog summing circuit 110, amplifier 115 and analog-to-digital converter 120 may be combined to form a simplified arrangement.

FIG. 3 illustrates a circuit based on the charge redistribution arrangement of FIG. 2 incorporating a sigma-delta modulator that performs the functions of digital-to-analog converter 105, analog summer 1110 and analog-to-digital converter 120. Referring to FIG. 3, the capacitor charge redistribution arrangement includes switches 320-1 through 320-M, capacitors 325-1 through 325-M, capacitor 340 and switch 350. As in FIG. 2, capacitors 325-1 through 325-M in cooperation with switches 320-1 through 320-M provide a charge redistribution type network controlled by control logic 301. The resultant charge is transferred via lead 330 to capacitor 340 in sigma-delta modulator 360. The values of capacitors 325-1 through 325-M are selected in ascending binary order. Capacitor 325-M corresponds to the most significant bit of the m bit signal from synthesizer 105. Capacitor 325-M-1 is one-half the value of capacitor 325-M and capacitor 225-M-2 is one-fourth the value of capacitor 325-M. Capacitor 325-1 corresponds to the least significant bit of the synthesizer output and is $1/2^M$ of the value of capacitor 325-M.

The circuit of FIG. 3 operates on each m bit output of synthesizer 105. In the initial portion of each sampling period, switch 350 is grounded. Switches 320-1 through 320-M-1 connect the lower plates of capacitors 325-1 through 325-M-1 to line 305 so that these capacitors are charged to the present value of incoming signal s(t). Capacitor 340 is connected to ground line 310 or to $V_{ref}$ line 315 depending on the previous output of the sigma-delta modulator 360 through switch 345 under control of the sigma-delta logic circuit. Switch 320-M connects capacitor 325-M to line 315 so that is charged to voltage $V_{ref}$. During the subsequent interval of the sampling period, 350 connects line 130 to the negative input of amplifier 335. Switches 320-1 through 320-M are connected either to ground via line 310 or to voltage $V_{ref}$ via line 315 according to the state of the corresponding bit of the m bit signal from synthesizer 101. If the most significant bit is a one, switch 320-M connects the lower plate of capacitor 225-M to ground. If the less significant bits $B_1 \ldots B_{M-1}$ are ones, the lower plates of respective capacitors 325-1 through 325-M-1 are connected to $V_{ref}$. The charges on capacitors 225-1 to 225-M are redistributed and transferred to capacitor 340 which functions in sigmadelta modulator 360 as generally described in the article "A Use of Double Integration in Sigma-Delta Modulation" by James C. Candy appearing in the *IEEE Transactions on Communications*, Vol. COM-33, No. 3, March 1985, pp. 249-258. The output of sigma-delta modulator 360 is then and n-m bit digital signal corresponding to the difference between the received analog signal s(t) and m bit digital signal from synthesizer 101. The calibration of the capacitors of FIG. 3 is substantially similar to the arrangements described with respect to FIG. 2.

The invention has been described with reference to illustrative embodiments thereof. It is apparent, however, that various modifications and changes may be made by one skilled in the art without departing form the spirit and scope of the invention.

I claim:

1. A circuit for converting an analog signal into an n bit digital signal representative thereof comprising:
   means for receiving an analog signal having a predetermined component,
   means for storing at least one information signal corresponding to the predetermined component of the received analog signal, the stored information signal comprising a plurality of stored digital signals related to the predetermined component,
   means comprising a digital filter responsive to the plurality of stored digital signals for forming an m bit digital signal representative of a predetermined of the received analog signal,
   means for forming an analog signal representative of the difference between the received analog signal and the predetermined component m bit digital signal,
   means for converting the analog difference representative signal to an n-m bit digital signal, and
   means jointly responsive to the predetermined component m bit digital signal and the n-m bit digital signal corresponding to the difference representa-
tive signal for forming the n bit digital signal representing the received analog signal.

2. A circuit for converting an analog signal into an n bit digital signal representative thereof according to claim 1 wherein the means for forming an analog signal representative of the difference between the received analog signal and the predetermined component m bit digital signal comprises means responsive to the m bit digital signal and the received analog signal for producing a signal having a quantized component representative of the difference between the m bit digital signal and the received analog signal.

3. A circuit for converting an analog signal into an n bit digital signal representative thereof according to claim 2 wherein the means for producing a signal having a quantized component representative of the difference between the m bit digital signal and the received analog signal comprises
   means for forming a charge signal corresponding to each bit of the m bit digital signal,
   means for forming a charge signal corresponding to the received analog signal, and
   means for combining the bit corresponding charge signals and the received analog signal corresponding charge signal.

4. A circuit for converting an analog signal into an n bit digital signal representative thereof according to claims 1, 2 or 3 wherein the difference representative signal forming means further comprises means for amplifying the signal having the quantized component and means for applying the amplified quantized signal to the n-m bit converting means.

5. A circuit for converting an analog signal into an n digital signal representative thereof according to claim 1 wherein the means for forming the n bit digital signal representing the received analog signal comprises means for summing the m bit predetermined component digital signal and the n-m bit digital signal corresponding to the difference representative signal.

6. A circuit for converting an analog signal into an n bit digital signal representative thereof according to claim 5 wherein
   the means for forming an analog signal representative of the difference between the received analog signal and the predetermined component m bit digital signal includes elements causing variations in the difference representative signal, and
   further comprises
   means responsive to the n-m bit difference representative signal for generating a set of correction signals representing the variations in the difference representative signal,
   means connected between the m bit digital signal forming means and the means for summing the m bit predetermined component digital signal and the n-m bit digital signal corresponding to the difference representative signal for combining the m bit digital signal with the correction signals to produce a corrected m bit digital signal, and
   the means for summing the m bit predetermined component digital signal and the n-m bit digital signal corresponding to the difference representative signal comprises means for adding the corrected m bit digital signal to the n-m bit digital signal corresponding to the difference representative signal.

7. A method for converting an analog signal into an n bit digital signal representative thereof comprising:

receiving an input analog signal having a predetermined component, storing an information signal comprising a plurality of stored digital signals corresponding to the predetermined component of the input analog signal, modifying the plurality of stored digital signals to produce an m-bit digital signal representative of the predetermined component, forming an analog signal representative of the difference between the received analog signal and the m bit digital signal, producing an n-m bit digital signal corresponding to the analog difference representative signal, and combining the predetermined component m bit digital signal and the n-m bit difference representative signal to form the n bit digital signal corresponding to the input analog signal.

8. A method for converting an analog signal into an n bit digital signal representative thereof according to claim 7 wherein the step of forming an analog signal representative of the difference between the received analog signal and the predetermined component m bit digital signal comprises producing a signal having a quantized component representative of the difference between the m bit digital signal and the received analog signal responsive to the m bit digital signal and the received analog signal.

9. A method for converting an analog signal into an n bit digital signal representative thereof according to claim 8 wherein the step of producing a signal having the quantized component representative of the difference between the m bit digital signal and the received analog signal comprises forming a charge signal corresponding to each bit of the m bit digital signal, forming a charge signal corresponding tot he received analog signal, and combining the bit corresponding charge signals and the received analog signal corresponding charge signal.

10. A method for converting an analog signal into an n bit digital signal representative thereof according to claims 8 or 9 wherein the difference representative signal forming step further comprises amplifying the signal having the quantized component and applying the amplified quantized signal to the n-m bit converting means.

11. A method or converting an analog signal into an n bit digital signal representative thereof according to claim 7 wherein the step of combining the m bit predetermined component digital signal and the n-m bit digital signal corresponding to the difference representative signal comprises summing the m bit predetermined component digital signal and the n-m bit digital signal corresponding to the difference representative signal.

* * * * *